(12) United States Patent
Sisodia et al.

(10) Patent No.: US 11,901,290 B2
(45) Date of Patent: Feb. 13, 2024

(54) BITCELL ARCHITECTURE USING BURIED METAL

(71) Applicant: Arm Limited, Cambridge (GB)

(72) Inventors: Rajiv Kumar Sisodia, Bangalore (IN); Andy Wangkun Chen, Austin, TX (US)

(73) Assignee: Arm Limited, Cambridge (GB)

(*) Notice: Subject to any disclaimer, the term of this patent is extended or adjusted under 35 U.S.C. 154(b) by 158 days.

(21) Appl. No.: 17/149,145

(22) Filed: Jan. 14, 2021

(65) Prior Publication Data

US 2022/0223514 A1     Jul. 14, 2022

(51) Int. Cl.
| | | |
|---|---|---|
| *H01L 23/528* | (2006.01) | |
| *H01L 21/8238* | (2006.01) | |
| *H10B 10/00* | (2023.01) | |
| *H01L 23/522* | (2006.01) | |
| *H01L 27/092* | (2006.01) | |

(52) U.S. Cl.
CPC .... *H01L 23/528* (2013.01); *H01L 21/823871* (2013.01); *H01L 23/5226* (2013.01); *H01L 27/092* (2013.01); *H10B 10/00* (2023.02); *H10B 10/12* (2023.02)

(58) Field of Classification Search
CPC .......... H01L 23/528; H01L 21/823871; H01L 23/5226; H01L 27/092; H01L 27/11; H01L 27/1104; H01L 27/0207; H01L 2924/1437; G11C 14/0054; G11C 11/41; G11C 11/417; G06F 2212/221; H10B 10/00; H10B 10/12
See application file for complete search history.

(56) References Cited

U.S. PATENT DOCUMENTS

| | | | | |
|---|---|---|---|---|
| 2008/0150007 A1* | 6/2008 | Brennan | ........... | H01L 21/76837 |
| | | | | 257/E21.21 |
| 2009/0086559 A1* | 4/2009 | Ohsawa | ................ | G11C 11/406 |
| | | | | 365/205 |
| 2011/0241102 A1* | 10/2011 | Cho | ..................... | H01L 29/7827 |
| | | | | 257/329 |
| 2014/0209993 A1* | 7/2014 | Lu | ........................ | H01L 21/0214 |
| | | | | 438/591 |
| 2016/0322363 A1* | 11/2016 | Tomishima | .......... | H01L 27/0886 |
| 2018/0158526 A1* | 6/2018 | Kim | ..................... | H01L 45/1233 |
| 2018/0350905 A1* | 12/2018 | Yoon | ................. | H01L 27/10897 |
| 2020/0219890 A1* | 7/2020 | Chong | .................. | G11C 11/419 |
| 2020/0373240 A1* | 11/2020 | Vadi | ..................... | H01L 23/5283 |

* cited by examiner

*Primary Examiner* — Galina G Yushina
(74) *Attorney, Agent, or Firm* — Pramudji Law Group PLLC; Ari Pramudji (57) ABSTRACT

Various implementations described herein are related to a device having multiple transistors that are arranged as a bitcell. The device may include multiple wordlines that are coupled to the multiple transistors. Also, one or more wordlines may be formed with frontside metal, and one or more other wordlines may be formed with buried metal.

20 Claims, 8 Drawing Sheets

BITCELL ARCHITECTURE USING BURIED METAL

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional circuit designs, an 8-transistor (8T) static random access memory (SRAM) bitcell having two wordlines (as compared to a 6T SRAM bitcell having one wordline) typically has to accommodate the two wordlines in the same pitch. This deficiency may cause a narrow device width, and spacing for the two wordlines may lead to high resistance, which may degrade memory performance. As such, there exists a need to overcome this deficiency by improving the bitcell layout design of 8T SRAM bitcells in memory applications.

BRIEF DESCRIPTION OF THE DRAWINGS

Implementations of various memory layout schemes and techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to bitcell layout fabrication schemes and techniques for multi-port memory applications in physical design. For instance, the various schemes and techniques described herein may provide for a multi-transistor (e.g., 8T) static random access memory (SRAM) bitcell using buried metal to improve performance and write margin. In some memory applications, a write wordline (WWL) and a read wordline (RWL) may be accommodated in the same height of the bitcell, which makes the wordlines (WWL, RWL) in lower technologies narrow and in close proximity to each other, which may increase coupling capacitance between the wordlines (WWL, RWL). Thus, various schemes and techniques described herein are configured to provide for routing one of the wordlines in buried metal and routing the other wordline in frontside metal. Accordingly, this bitcell layout design scheme and technique may avoid routing complexity and further allow at least one of the wordlines to be routed with increased width for improved performance.

In some implementations, the various bitcell fabrication schemes and techniques described herein provide for a novel bitcell architecture in physical layout design of multi-port SRAM bitcell structures using complementary field-effect transistor (FET) technology. Also, various bitcell fabrication schemes and techniques described herein provide multi-port (e.g., two-port) memory structure with multi-cell poly pitch. In some implementations, the schemes and techniques described herein provide for an innovative 8T bitcell using buried metal that is designed for low wordline resistance/capacitance and low source voltage (VDD) resistance while coping with sub-nanometer process manufacturing limitations. The bitcell architecture described herein may provide for widening the width of the wordlines (e.g., WWL, RWL) so as to mitigate the impact of larger metal resistance. Also, in reference to positive impacts on performance, the novel bitcell layout architecture may advantageously cause lower resistance and/or lower capacitance on the wordline-net, which may thus improve performance/access-time of the memory-macro.

Various implementations of providing bitcell architecture with buried metal will be described herein with reference to FIGS. 1-8.

Figure 1:
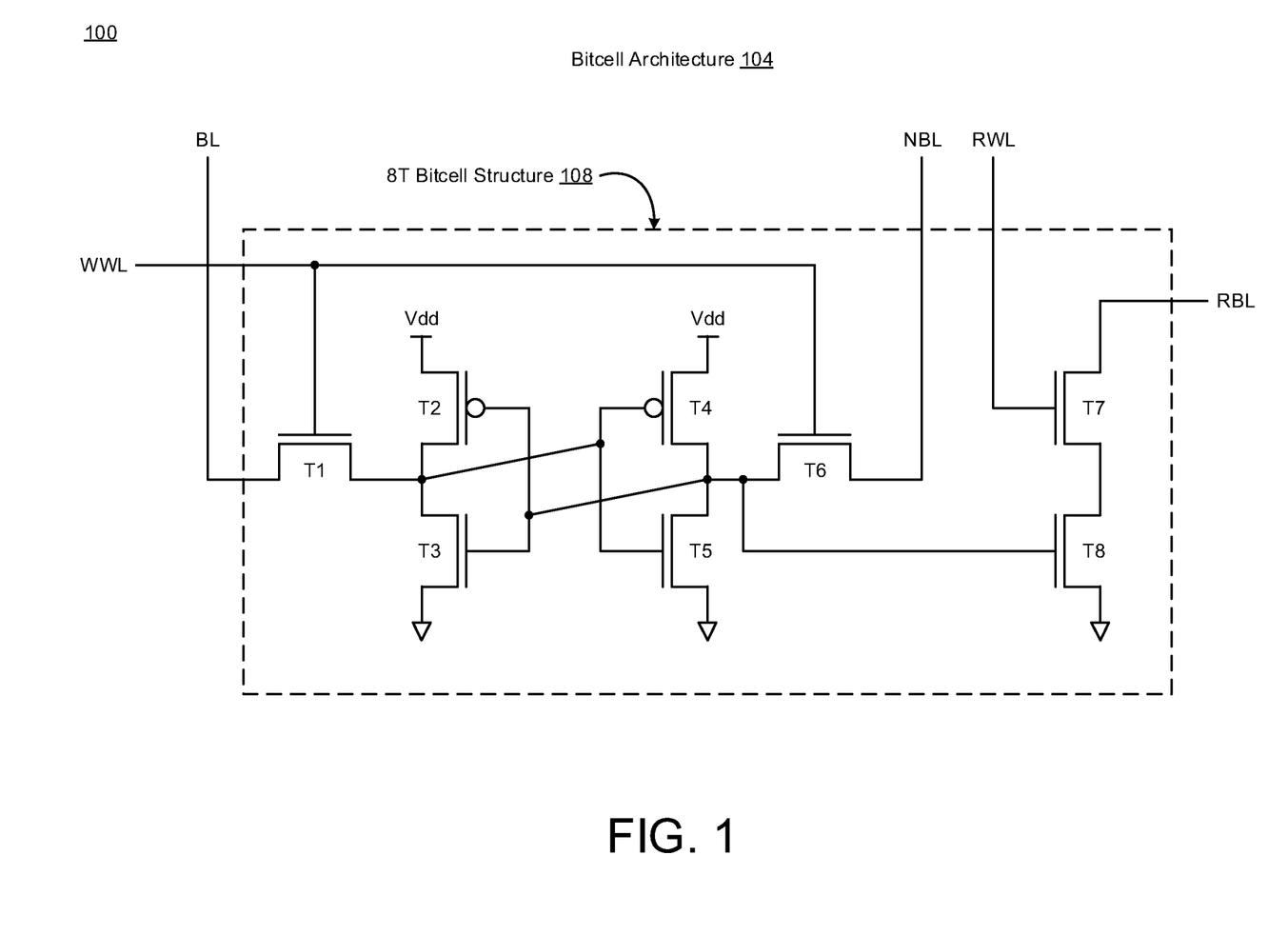
FIG. 1 illustrates a schematic diagram of bitcell architecture with buried metal in accordance with various implementations described herein.

FIG. 1 illustrates a schematic diagram 100 of bitcell architecture 104 with buried metal in accordance with various implementations described herein.

In various implementations, the bitcell architecture 104 may be implemented as a system or a device having various integrated circuit (IC) components that are arranged and coupled together as an assemblage or combination of parts that provide for physical circuit designs and various related structures. In some instances, a method of designing, providing and/or fabricating the bitcell architecture 104 as an integrated system or device may involve use of various IC circuit components described herein so as to implement bitcell fabrication schemes and techniques associated therewith. Moreover, the bitcell architecture 104 may be integrated with computing circuitry and related components on a single chip, and the bitcell architecture 104 may be implemented and incorporated in various embedded systems for automotive, electronic, mobile, server and Internet-of-things (IoT) applications.

As shown in FIG. 1, the bitcell architecture 104 may include multiple transistors (T1, T2, . . . , T8) that are arranged as an eight-transistor (8T) multi-port memory cell with a dedicated write port and a dedicated read port. The write port may include a write wordline (WWL) and write bitlines (BL, NBL), and the dedicated read port may include a read wordline (RWL) and a read bitline (RBL). In various implementations, as described herein, one or more of the write wordline (WWL), the write bitlines (BL, NBL), the read wordline (RWL) and the read bitline (RBL) may be routed in buried metal. Also, the transistors (T1, T2, . . . , T8) may be configured to store data during write operations and allow access of data during read operations. The transistors (T1, T2, T3, T4, T5, T6) are arranged to store data during write operations, and the transistors (T7, T8) are arranged to read data during read operations. The transistors (T2, T3, T4, T5) are cross-coupled and disposed between the source voltage (VDD) and ground (VSS). Also, passgate transistor (T1) is coupled between the write bitline (BL) and transistors (T2, T3), and passgate transistor (T6) is coupled between the write bitline (NBL) and transistors (T4, T5). The write bitline (NBL) is a complement to the write bitline (BL). The write wordline (WWL) is coupled to gates of transistors (T1, T6). Also, transistors (T7, T8) are coupled in series between the read bitline (RBL) and ground (VSS).

Moreover, the read wordline (RWL) is coupled to the gate of transistor (T7), and also, the gate of the transistor (T8) is coupled between transistors (T4/T5 and T6).

In some implementations, the bitcell architecture 104 may refer to a static random access memory (SRAM) bitcell, which may have access ports controlled by wordlines (WL, RWL) and bitlines (BL, NBL, RBL). In some instances, the SRAM bitcell may be implemented with an 8T multi-port bitcell. Also, in some instances, transistors (T2, T4) may refer to P-type field effect transistor (PFET) devices, and transistors (T1, T3, T5, T6, T7, T8) may refer to N-type field effect transistor (NFET) devices. Moreover, the multiple access port devices may be varied within the 8T multiple-port bitcell so that some access devices (by port) are NFET devices and some access devices by port are PFET devices.

Figure 2:
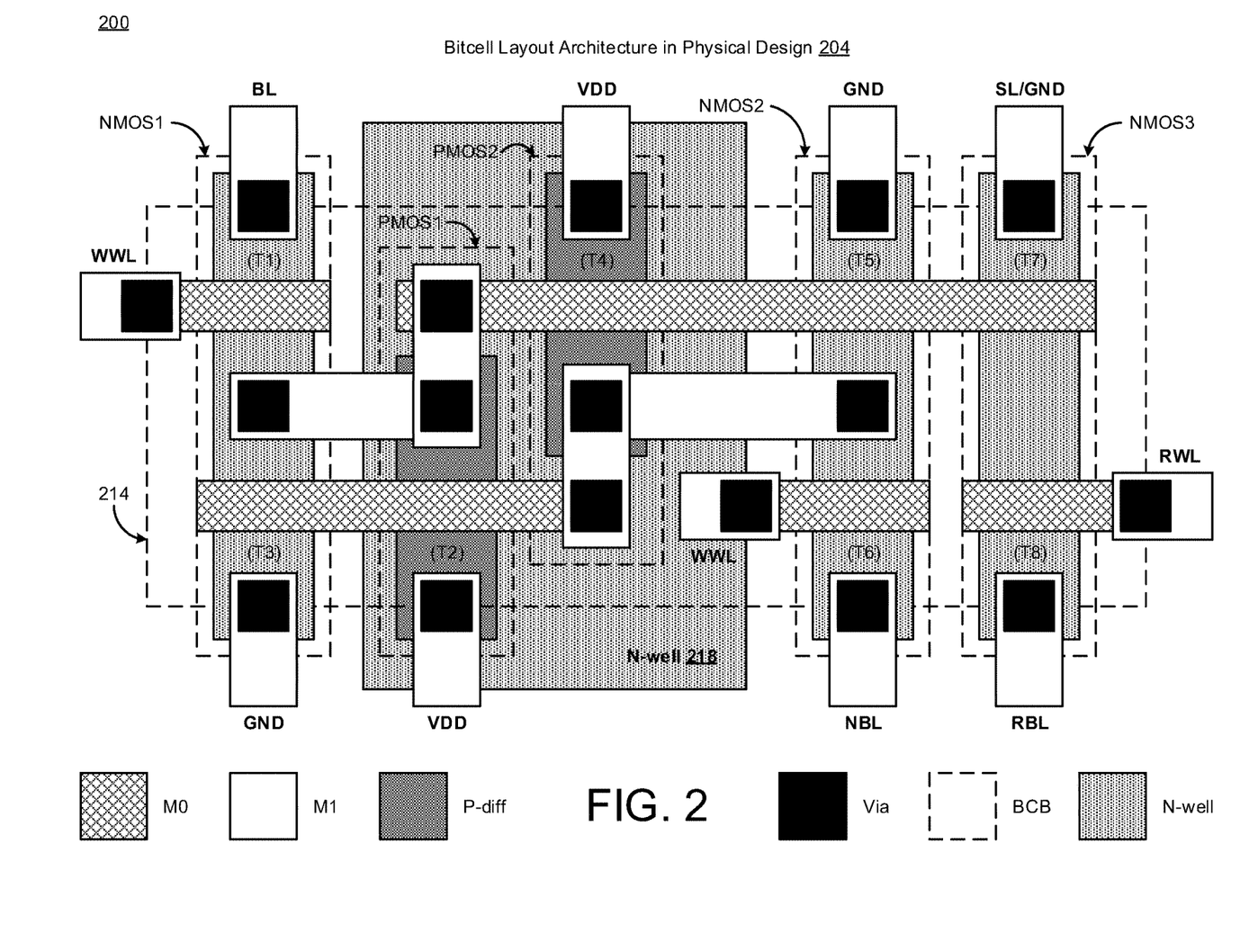
FIG. 2 illustrates a schematic diagram of bitcell layout architecture in physical design in accordance with various implementations described herein.

FIG. 2 illustrates a schematic diagram 200 of bitcell layout architecture 204 in physical design in accordance with various implementations described herein. In particular, FIG. 2 shows a two-dimensional (2D) top-view bitcell layout architecture 204 in physical design with buried metal. Moreover, the bitcell layout architecture 204 in FIG. 2 provides a physical layout design of the bitcell architecture 104 shown in FIG. 1.

In various implementations, the bitcell layout architecture 204 may be implemented as a system or a device having various integrated circuit (IC) components that are arranged and coupled together as an assemblage or combination of parts that may provide for physical circuit layout designs along with various related structures. In various instances, a method of designing, providing, building, and/or fabricating the bitcell layout architecture 204 as an integrated system or device may involve use of various IC circuit components as described herein so as to implement bitcell layout schemes and techniques associated therewith. Also, the bitcell layout architecture 204 may be integrated in various computing circuitry and related components on a single chip, and the bitcell layout architecture 204 may be implemented and incorporated in various embedded systems for automotive, electronic, mobile, server and Internet-of-things (IoT) applications, including remote sensor nodes.

As shown in FIG. 2, the bitcell layout architecture 204 in physical design may include multiple transistors (NMOS1, NMOS2, NMOS3, PMOS1, PMOS2) that are arranged as a bitcell, such as, e.g., the 8T multi-port bitcell structure 108 shown in FIG. 1. In some instances, the bitcell refers to a static random access memory (SRAM) bitcell, and also, the multiple transistors (NMOS1, NMOS2, NMOS3, PMOS1, PMOS2) include 8-transistors (8T) that are arranged as the SRAM bitcell. In some instances, transistors NMOS1 may refer to transistors (T1, T3) in the bitcell structure 108 of FIG. 1, and transistors NMOS2 may refer to transistors (T5, T6) in the bitcell structure 108 of FIG. 1, and transistors NMOS3 may refer to transistors (T7, T8) in the bitcell structure 108 of FIG. 1. Also, transistor PMOS1 may refer to transistor (T2) in the bitcell structure 108 of FIG. 1, and transistor PMOS2 may refer to transistor (T4) in the bitcell structure 108 of FIG. 1. Thus, the multiple transistors may refer to P-type transistors (PMOS1, PMOS2) and N-type transistors (NMOS1, NMOS2, NMOS3) that are arranged in the 8T bitcell structure 108 as a bitcell.

The bitcell layout architecture 204 in physical design may have a bitcell boundary (BCB 214) that is defined around and surrounds the entire 8T multi-port bitcell. Also, each transistor (NMOS1, NMOS2, NMOS3, PMOS1, PMOS2) may have a bitcell boundary (BCB) that is defined around and surrounds the transistors. Also, an N-well may be formed adjacent each of the NMOS transistors (NMOS1, NMOS2, NMOS3) and also adjacent to the PMOS transistors (PMOS1, PMOS2). Also, a P-diffusion region (P-diff) may be formed adjacent to the PMOS transistors (PMOS1, PMOS2) and within the large centralized N-well 218.

The bitcell layout architecture 204 in physical design may have multiple wordlines (WWL, RWL) and multiple bitlines (BL, NBL, RBL) that are coupled to the multiple transistors (e.g., NMOS1, NMOS2, NMOS3, PMOS1, PMOS2). Also, the bitcell layout architecture 204 may have supply voltage (VDD) and ground (VSS or GND) coupled to the multiple transistors (e.g., NMOS1, NMOS2, NMOS3, PMOS1, PMOS2). Also, in some instances, a sense line (SL) may be used instead of ground (VSS or GND). Further, as shown in FIG. 2, vias may be used to couple the wordlines (WWL, RWL) and the bitlines (BL, NBL, RBL) to the multiple transistors (NMOS1, NMOS2, NMOS3, PMOS1, PMOS2). In various instances, one or more wordlines (WWL and/or RWL) may be formed with frontside metal (e.g., M0, M1), and one or more other wordlines (WWL and/or RWL) may be formed with and/or coupled to buried metal (BM0, BM1), as will be shown and described herein in reference to FIGS. 3-7.

In some implementations, the write wordline (WWL) may be coupled to transistor (T1) formed adjacent to an upper portion of NMOS1, and also, the write wordline (WWL) may be coupled to transistor (T6) formed adjacent to a lower portion of NMOS2. The write bitline (BL) may be coupled to transistor (T1) formed adjacent to the upper portion of NMOS1, and ground (VSS or GND) may be coupled to transistor (T3) formed adjacent to a lower portion of NMOS1. Also, the supply voltage (VDD) may be coupled to transistor (T2) formed adjacent to a lower portion of PMOS1, and the supply voltage (VDD) may be coupled to transistor (T4) formed adjacent to an upper portion of PMOS2. Also, the write bitline (NBL) may be coupled to transistor (T6) formed adjacent to a lower portion of NMOS2, and ground (VSS or GND) may be coupled to transistor (T5) formed adjacent to an upper portion of NMOS2. Also, the read wordline (RWL) may be coupled to transistor (T7) formed adjacent to a lower portion of NMOS3, and the read bitline (RBL) may be coupled to transistor (T7) formed adjacent to the lower portion of NMOS2, and the sense line (SL) or ground (VSS or GND) may be coupled to transistor (T8) formed adjacent to an upper portion of NMOS3.

FIGS. 3-7 illustrate diagrams of bitcell layout architecture in physical design with buried metal in accordance with various implementations described herein. The bitcell layout architectures as shown in FIGS. 3-7 provide various three-dimensional (3D) implementation views of the bitcell architecture 204 shown in FIG. 2, wherein frontside metal rails are used to coupled to some of transistors in the bitcell structure to a frontside power delivery network (PDN), and wherein buried backside metal rails are used to coupled to some of transistors in the bitcell structure to a buried backside power delivery network (PDN).

Figure 3:
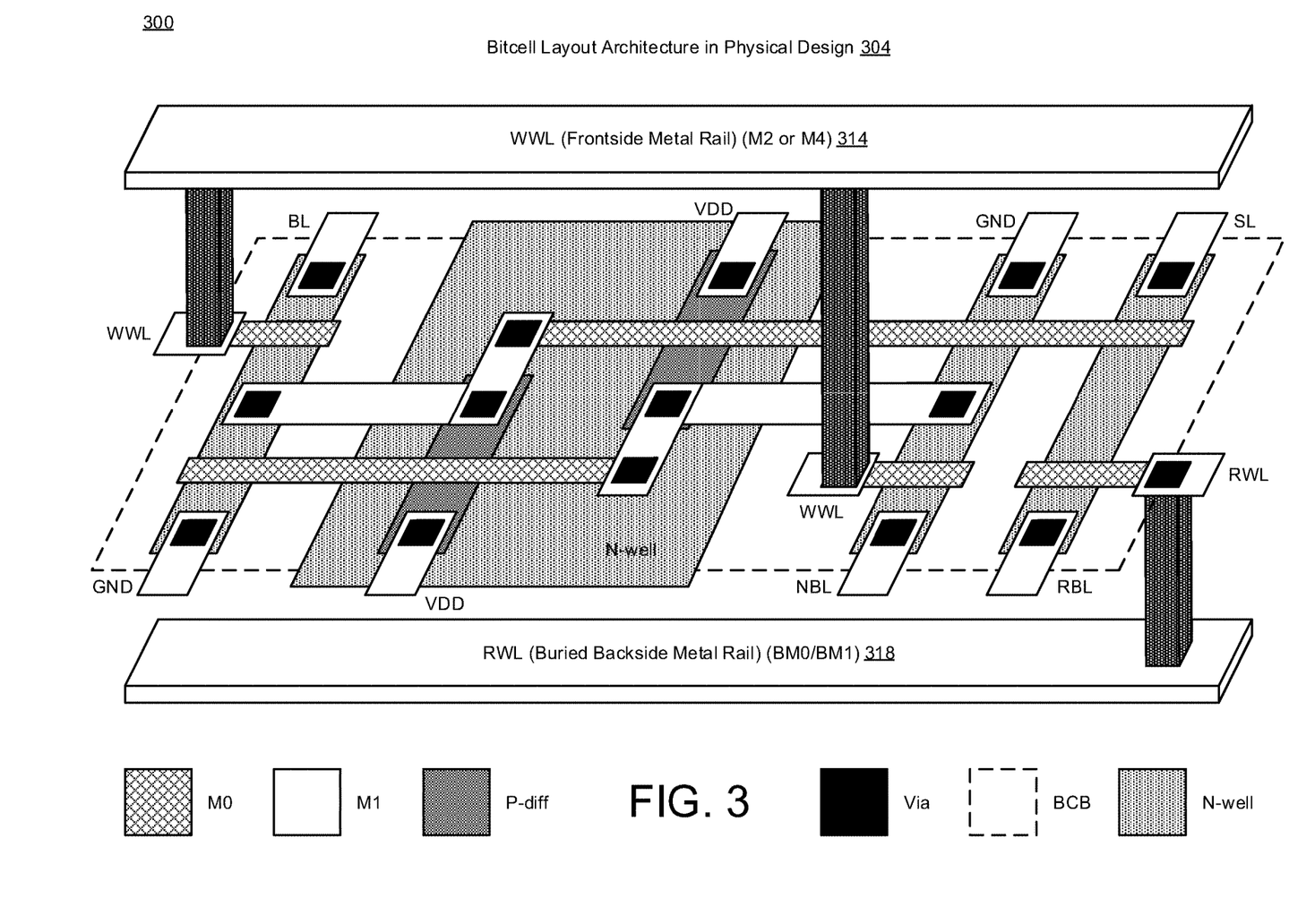
FIGS. 3-7 illustrate diagrams of bitcell layout architecture in physical design with buried metal in accordance with various implementations described herein.

FIG. 3 illustrates a diagram 300 of bitcell layout architecture 304 with the write wordline (WWL) coupled to frontside metal rail 314 (M2 or M4) and the read wordline (RWL) coupled to buried backside metal rail 318 (BM0 or BM1).

As shown in reference to FIGS. 1-3, the multiple transistors may refer to passgate transistors (T1, T6) and read transistor (T7). Also, the write wordline (WWL) may be formed with and/or coupled to frontside metal, such as, e.g., frontside metal rail 314 (M2 or M4), and further, the write wordline (WWL) may be coupled to passgate transistors (T1, T6). Moreover, the read wordline (RWL) may be formed with and/or coupled to buried backside metal, such as, e.g., buried backside metal rail 318 (BM0/BM1), and also, the read wordline (RWL) may be coupled to the read transistor (T7).

In some implementations, as shown in FIG. 3, the RWL is routed in buried metal while the WWL is routed in frontside metal. This novel bitcell layout approach may allow for the wordlines (RWL, WWL) to be formed wider (i.e., with a wider width) as well as isolate the wordlines (RWL, WWL) from capacitive-coupling, which improves performance.

Figure 4:
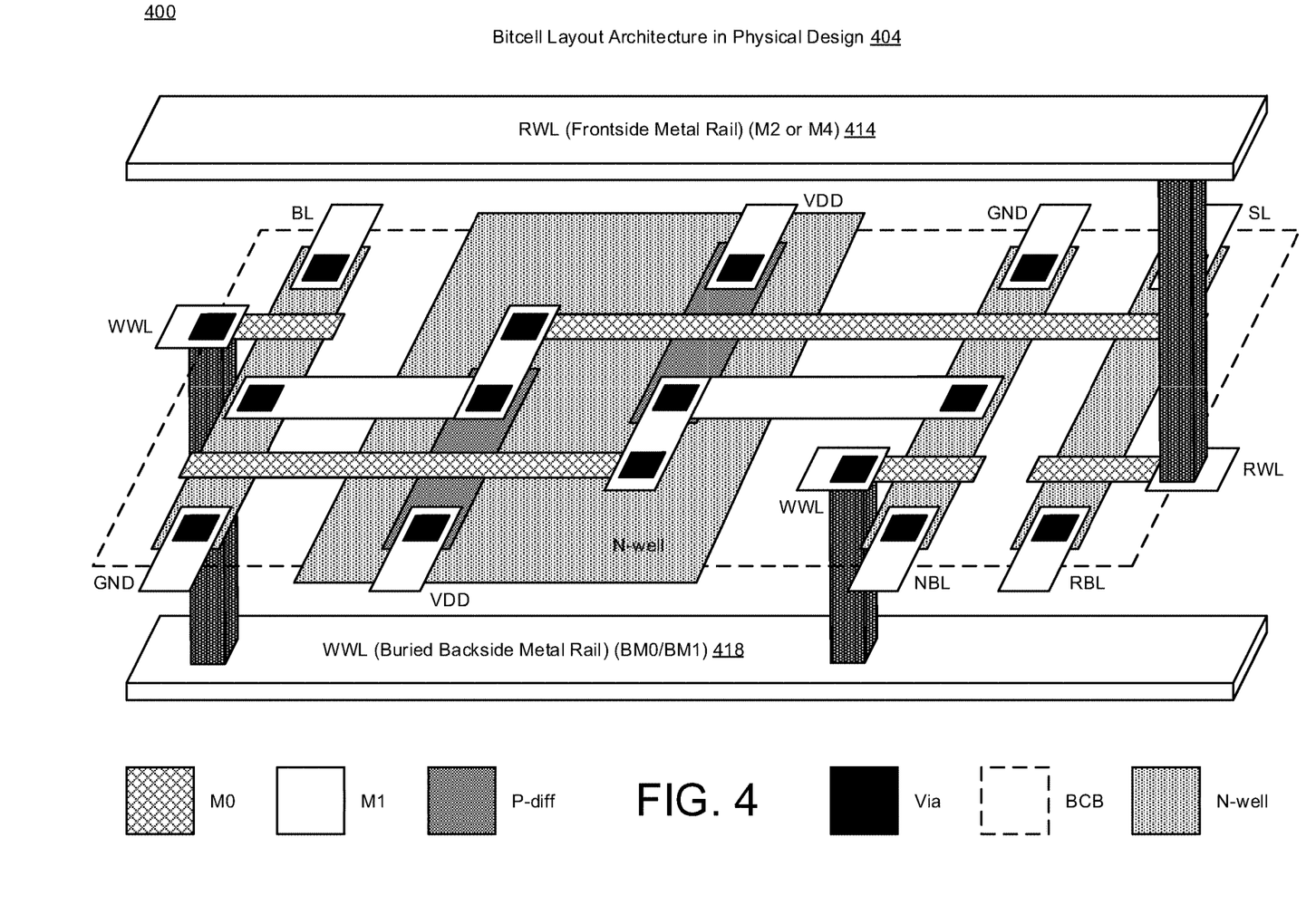

FIG. 4 illustrates a diagram 400 of bitcell layout architecture 404 with the read wordline (RWL) coupled to frontside metal rail 414 (M2 or M4) and the write wordline (WWL) coupled to buried backside metal rail 418 (BM0 or BM1).

As shown in reference to FIGS. 1-2 and 4, the multiple transistors may include passgate transistors (T1, T6) and read transistor (T7). Also, the read wordline (RWL) may be formed with and/or coupled to frontside metal, such as, e.g., frontside metal rail 414 (M2 or M4), and the read wordline (RWL) may be coupled to read transistor (T7). Moreover, the write wordline (WWL) may be formed with and/or coupled to buried backside metal, such as, e.g., buried backside metal rail 418 (BM0/BM1), and also, the write wordline (WWL) may be coupled to the passgate transistors (T1, T6).

In some implementations, as shown in FIG. 4, the WWL is routed in buried metal while the RWL is routed in frontside metal. This novel bitcell layout approach may allow for the wordlines (WWL, RWL) to be formed wider (i.e., with a wider width) as well as isolate the wordlines (WWL, RWL) from capacitive-coupling, which improves performance.

Figure 5:
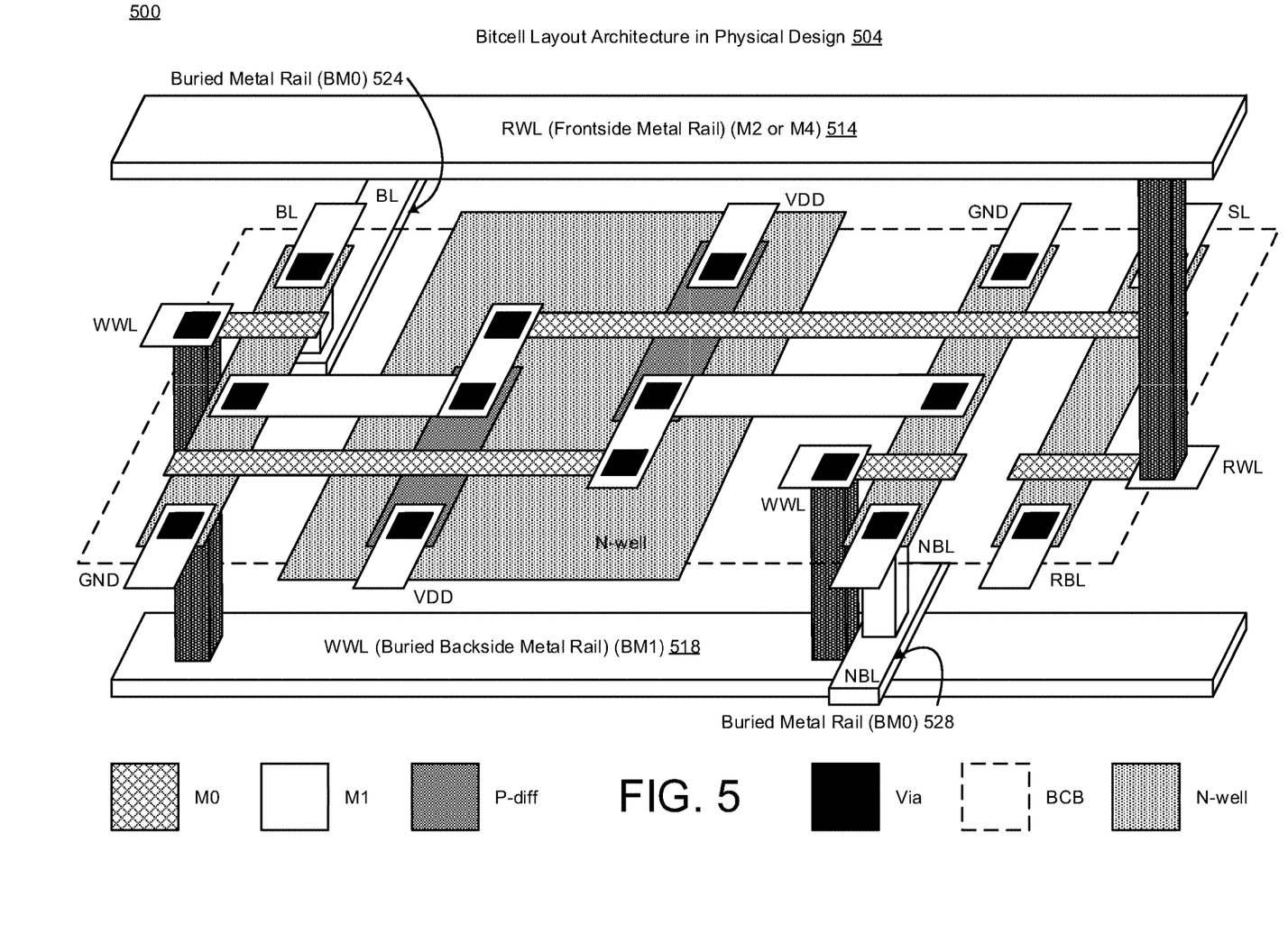

FIG. 5 illustrates a diagram 500 of bitcell layout architecture 504 with the read wordline (RWL) coupled to frontside metal rail 514 (M2 or M4) and the write wordline (WWL) coupled to buried backside metal rail 518 (BM1). Also, the write bitline (BL) may be coupled to buried backside metal rail 524 (BM0), and the complementary write bitline (NBL) may be coupled to buried backside metal rail 528 (BM0).

As shown in reference to FIGS. 1-2 and 4-5, the multiple transistors may include passgate transistors (T1, T6) and read transistor (T7). Also, the read wordline (RWL) may be formed with and/or coupled to frontside metal, such as, e.g., frontside metal rail 514 (M2 or M4), and the read wordline (RWL) may be coupled to read transistor (T7). Moreover, the write wordline (WWL) may be formed with and/or coupled to buried backside metal, such as, e.g., buried backside metal rail 518 (BM1), and the write wordline (WWL) may be coupled to the passgate transistors (T1, T6). Also, in some implementations, the write bitlines (BL, NBL) may be coupled to the passgate transistors (T1, T6), and the write bitlines (BL, NBL) may be formed with and/or coupled to the buried backside metal, such as, e.g., buried backside metal rails 524, 528 (BM0), respectively.

In some implementations, as shown in FIG. 5, the WWL is routed in buried metal while the RWL is routed in frontside metal. Also, the write bitlines (BL, NBL) are routed in buried metal. This novel bitcell layout approach may allow for the wordlines (WWL, RWL) to be formed wider (i.e., with a wider width) as well as isolate the wordlines (WWL, RWL) from capacitive-coupling, which improves performance.

Figure 6:
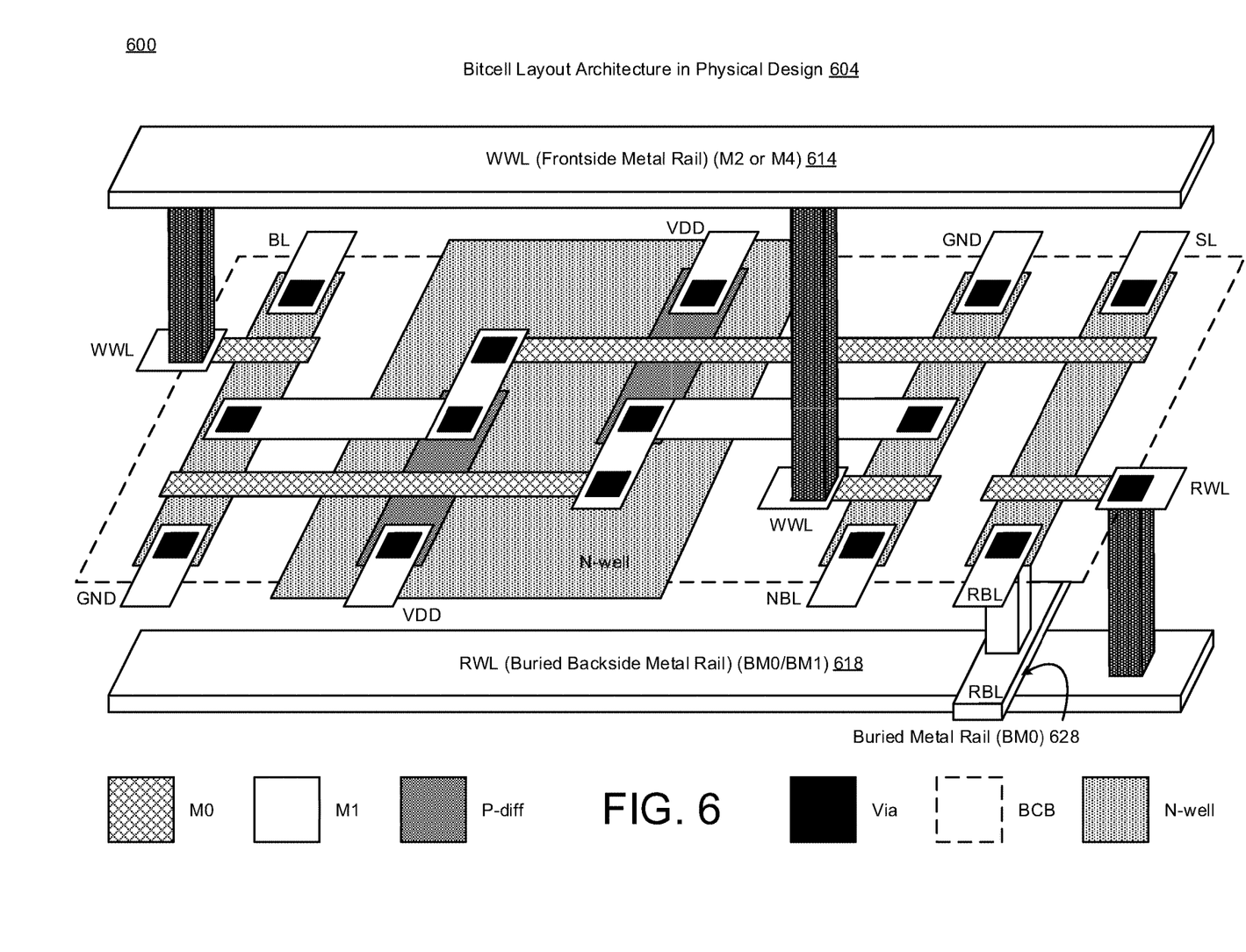

FIG. 6 illustrates a diagram 600 of bitcell layout architecture 604 with the write wordline (WWL) coupled to frontside metal rail 614 (M2 or M4) and the read wordline (RWL) coupled to buried backside metal rail 618 (BM1). Also, the read bitline (RBL) may be coupled to buried backside metal rail 628 (BM0).

As shown in reference to FIGS. 1-3 and 6, the multiple transistors may include passgate transistors (T1, T6) and read transistor (T7). Also, the write wordline (WWL) may be formed with and/or coupled to frontside metal, such as, e.g., frontside metal rail 614 (M2 or M4), and the write wordline (WWL) may be coupled to passgate transistors (T1, T6). Also, the read wordline (RWL) may be formed with and/or coupled to buried backside metal, such as, e.g., buried backside metal rail 618 (BM1), and the read wordline (RWL) may be coupled to the read transistor (T7). In some implementations, the read bitline (RBL) may be coupled to the read transistor (T7), and the read bitline (RBL) may be formed with and/or coupled to the buried backside metal, such as, e.g., buried backside metal rail 628 (BM0).

In some implementations, as shown in FIG. 6, the RWL is routed in buried metal while the WWL is routed in frontside metal. Also, the read bitline (RBL) is routed in buried metal. This novel bitcell layout approach may allow for the wordlines (RWL, WWL) to be formed wider (i.e., with a wider width) as well as isolate the wordlines (RWL, WWL) from capacitive-coupling, which improves performance.

Figure 7:
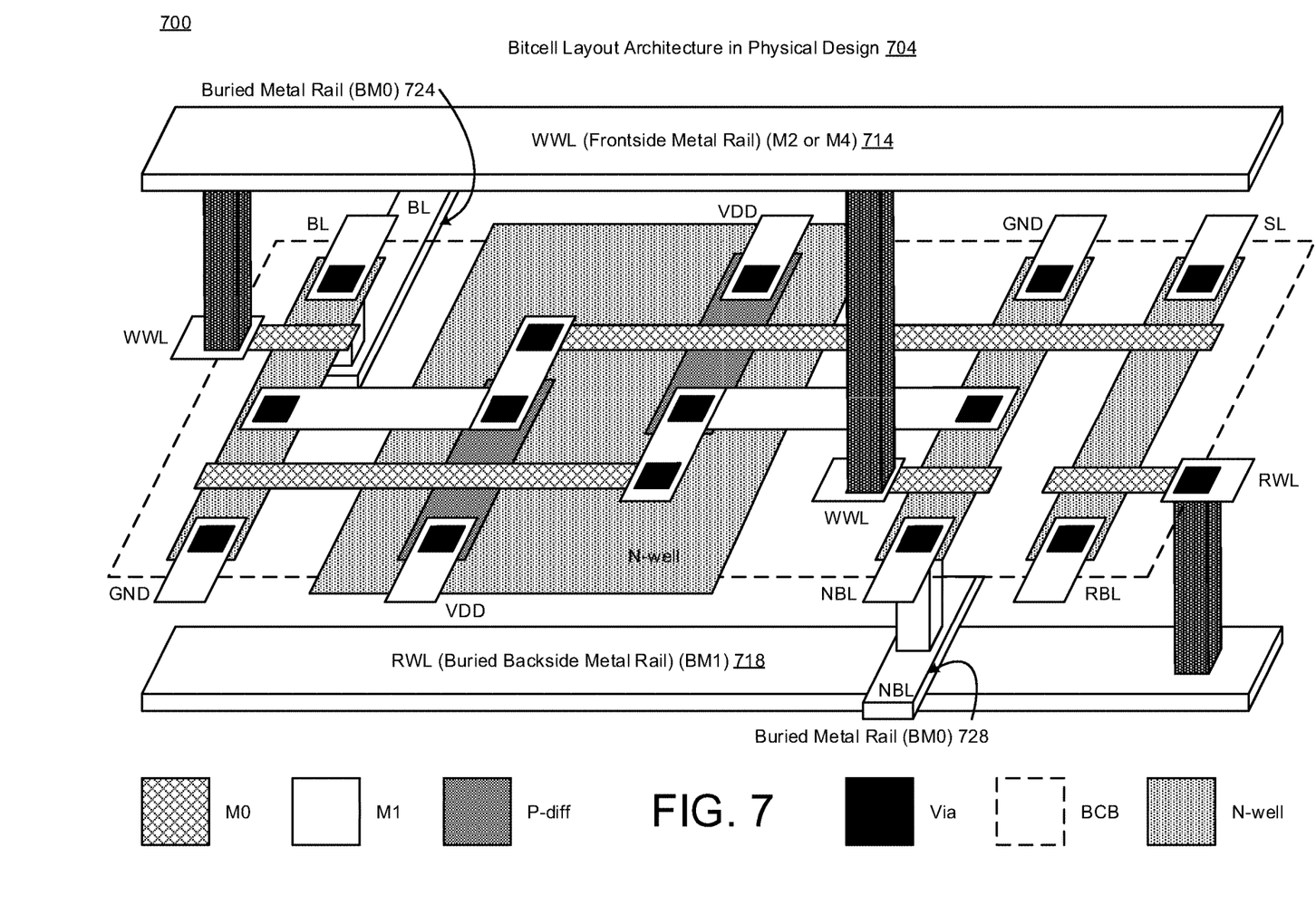

FIG. 7 illustrates a diagram 700 of bitcell layout architecture 704 with the write wordline (WWL) coupled to frontside metal rail 714 (M2 or M4) and the read wordline (RWL) coupled to buried backside metal rail 718 (BM1). Also, the write bitline (BL) may be coupled to buried backside metal rail 724 (BM0), and the complementary write bitline (NBL) may be coupled to buried backside metal rail 728 (BM0).

As shown in reference to FIGS. 1-3 and 7, the multiple transistors may include passgate transistors (T1, T6) and read transistor (T7). Also, the write wordline (WWL) may be formed with and/or coupled to frontside metal, such as, e.g., frontside metal rail 714 (M2 or M4), and further, the write wordline (WWL) may be coupled to passgate transistors (T1, T6). Also, the read wordline (RWL) may be formed with and/or coupled to buried backside metal, such as, e.g., buried backside metal rail 718 (BM1), and the read wordline (RWL) may be coupled to the read transistor (T7). In some implementations, the write bitlines (BL, NBL) may be coupled to the passgate transistors (T1, T6), and the multiple write bitlines (BL, NBL) may be formed with and/or coupled to the buried backside metal, such as, e.g., buried backside metal rail 724, 728 (BM0), respectively.

In some implementations, as shown in FIG. 7, the RWL is routed in buried metal while the WWL is routed in frontside metal. Also, the write bitlines (BL, NBL) are routed in buried metal. This novel bitcell layout approach may allow for the wordlines (RWL, WWL) to be formed wider (i.e., with a wider width) as well as isolate the wordlines (RWL, WWL) from capacitive-coupling, which improves performance.

In some implementations, in reference to FIGS. 1-7, various implementations as described herein refer to bitcell architecture using buried metal. The bitcell architecture may refer to a device having a physical layout of multiple transistors that are arranged in a bitcell structure. The bitcell architecture may have a first wordline coupled to first transistors of the transistors, and the first wordline may be formed with frontside metal. The bitcell architecture may have a second wordline coupled to second transistors of the transistors, and the second wordline may be formed with buried metal.

As shown in FIG. 3, the transistors may include passgate transistors and a read transistor, the first wordline formed with frontside metal may include a write wordline coupled to the passgate transistors, and the write wordline may be formed with frontside metal. Also, the second wordline formed with buried metal may include a read wordline coupled to the read transistor, and the read wordline is formed with buried metal. As shown in FIG. 7, the bitcell architecture may have write bitlines coupled to the passgate transistors, and the write bitlines may be formed with buried metal. As shown in FIG. 6, the bitcell architecture may have a read bitline coupled to the read transistor, and also, the read bitline may be formed with the buried metal.

As shown in FIG. 4, the transistors may include passgate transistors and a read transistor, the first wordline formed with frontside metal may include a read wordline coupled to the read transistor, and the read wordline may be formed with frontside metal. Moreover, the second wordline that is formed with buried metal may include a write wordline coupled to the passgate transistors, and the write wordline y bema formed with buried metal. As shown in FIG. 5, the bitcell architecture may have write bitlines coupled to the passgate transistors, and the write bitlines may be formed with the buried metal.

Figure 8:
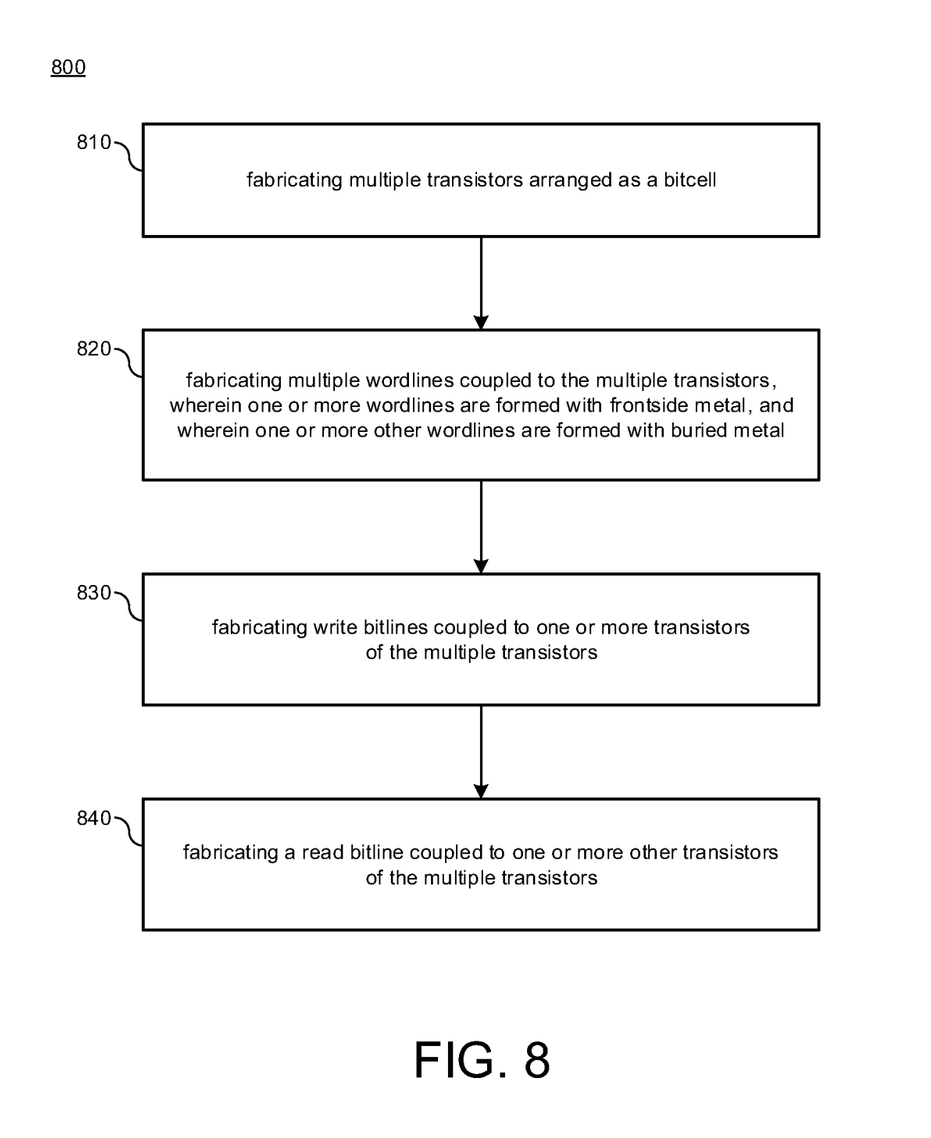
FIG. 8 illustrates a process diagram of a method for providing bitcell architecture with buried metal in accordance with implementations described herein.

As shown in reference to FIGS. 2-7, Table 1 below provides a comparison of the different embodiments and related advantages of the bitcell layout architecture.

nents and/or circuitry, as described in reference to FIGS. 1-7. If implemented in software, method 800 may be implemented as a program or software instruction process configured for providing bitcell architecture with buried metal, as described herein. Also, if implemented in software, instructions related to implementing the method 800 may be stored in memory and/or a database. For instance, a computer or various other types of computing devices having a processor and memory may be configured to perform method 800.

As described in reference to FIG. 8, the method 800 may be used for fabricating and/or manufacturing, or causing to be fabricated and/or manufactured, an integrated circuit (IC) that implements the various bitcell layout schemes and techniques in physical design as described herein for providing bitcell architecture with buried metal using various associated devices, components and/or circuitry described herein.

At block 810, method 800 may fabricate multiple transistors that are arranged as a bitcell, and also, at block 820, method 800 may fabricate multiple wordlines that are coupled to the multiple transistors, wherein one or more wordlines may be formed with frontside metal, and wherein one or more other wordlines are formed with buried metal. At block 830, method 800 may fabricate multiple write bitlines that are coupled to the passgate transistors, wherein the multiple write bitlines are formed with the buried metal. Moreover, at block 840, method 800 may fabricate a read bitline that is coupled to the read transistor, wherein the read bitline is formed with the buried metal. In some instances,

TABLE 1

| RWL | RBL | WWL | BL/NBL | Comment |
|---|---|---|---|---|
| Front | Front | Front | Front | This is conventional approach and has problems associated with coupling and resistance due to lower widths. |
| Buried | Front | Front | Front | Reduces the resistance on RWL and avoids Coupling between the Read and Write WLs. |
| Front | Front | Buried | Front | Reduces the resistance on WWL and avoids Coupling between the Read and Write WLs. |
| Front | Front | Buried | Buried | Reduces the resistance on WWL and avoids Coupling between the Read and Write WLs. Reduces the resistance on WBL making pull-down of the bitlines faster for write operation. Improves RBL capacitance. |
| Buried | Buried | Front | Front | Reduces the resistance on RWL and avoids Coupling between the Read and Write WLs. Reduces the resistance on RBL |
| Buried | Front | Front | Buried | Reduces the resistance on RWL and avoids Coupling between the Read and Write WLs. Reduces the resistance of WBLs making pull-down faster. Improves the RBL capacitance for faster discharge. |
| Front | Buried | Buried | Front | Reduces the resistance on RWL and avoids Coupling between the Read and Write WLs. Reduces the resistance of RBL and WWL. However, may not be more useful. |

FIG. 8 illustrates a diagram of a method 800 for providing bitcell architecture with buried metal in accordance with implementations described herein.

It should be understood that even though method 800 indicates a particular order of operation execution, in some cases, various portions of operations may be executed in a different order, and on different systems. In other cases, additional operations and/or steps may be added to and/or omitted from method 800. Also, method 800 may be implemented in hardware and/or software. If implemented in hardware, method 800 may be implemented with compomethod 880 may fabricate multiple write bitlines coupled to the passgate transistors, wherein the multiple write bitlines may be formed with the buried metal.

In some implementations, the multiple transistors may include passgate transistors and a read transistor, and the one or more wordlines that are formed with frontside metal may include a write wordline coupled to the passgate transistors. The write wordline may be formed with frontside metal, and the one or more other wordlines that are formed with buried metal include a read wordline coupled to the read transistor, and also, the read wordline may be formed with buried metal. In other implementations, the multiple transistors may include passgate transistors and a read transistor, and also, the one or more wordlines formed with frontside metal may include a read wordline coupled to the read transistor. Further, the read wordline may be formed with frontside metal, and the one or more other wordlines formed with buried metal include a write wordline coupled to the passgate transistors, and also, the write wordline may be formed with buried metal.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are implementations of a device having multiple transistors that are arranged as a bitcell. The device may include multiple wordlines that are coupled to the multiple transistors. One or more wordlines may be formed with frontside metal, and one or more other wordlines may be formed with buried metal.

Described herein are various implementations of a device with a physical layout of transistors that are arranged in a bitcell structure. The device may have a first wordline that is coupled to first transistors of the transistors, and the first wordline may be formed with frontside metal. The device may have a second wordline that is coupled to second transistors of the transistors, and the second wordline may be formed with buried metal.

Described herein are various implementations of a method. The method may fabricate multiple transistors that are arranged as a bitcell. The method may fabricate multiple wordlines that are coupled to the multiple transistors. One or more wordlines may be formed with frontside metal, and one or more other wordlines may be formed with buried metal.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, specific features and acts described above are disclosed as example forms of implementing the claims.

What is claimed is:

1. A device comprising:
   multiple transistors arranged as a bitcell; and
   multiple wordlines coupled to the multiple transistors,
   wherein at least one wordline of the wordlines is formed with a frontside metal rail, and
   wherein at least one other wordline of the wordlines is formed with a buried metal rail.

2. The device of claim 1, wherein the bitcell refers to a static random access memory (SRAM) bitcell, and wherein the multiple transistors include 8-transistors (8T) arranged as the SRAM bitcell.

3. The device of claim 1, wherein:
   the multiple transistors include passgate transistors and a read transistor,
   the at least one wordline of the wordlines includes a write wordline coupled to the passgate transistors, and this write wordline is formed with the frontside metal rail, and
   the at least one other wordline of the wordlines includes a read wordline coupled to the read transistor, and this read wordline is formed with the buried metal rail.

4. The device of claim 3, further comprising:
   multiple write bitlines coupled to the passgate transistors, wherein the multiple write bitlines are formed with other buried metal rails.

5. The device of claim 3, further comprising:
a read bitline coupled to the read transistor, wherein the read bitline is formed with another buried metal rail.

6. The device of claim 1, wherein:
the multiple transistors include passgate transistors and a read transistor,
the at least one wordline of the wordlines formed with the frontside metal rail includes a read wordline coupled to the read transistor, and the read wordline is formed with the frontside metal rail, and
the at least one other wordline of the wordlines formed with the buried metal rail includes a write wordline coupled to the passgate transistors, and the write wordline is formed with the buried metal rail.

7. The device of claim 6, further comprising:
multiple write bitlines coupled to the passgate transistors, wherein the multiple write bitlines are formed with other buried metal rails.

8. The device of claim 1, wherein the multiple transistors include P-type transistors and N-type transistors that are arranged in a bitcell structure as the bitcell.

9. A device comprising:
a bitcell having a physical layout of first transistors and second transistors arranged in a bitcell structure;
a first wordline coupled to the first transistors of the bitcell, wherein the first wordline is formed with a frontside metal rail; and
a second wordline coupled to one of the second transistors of the bitcell, wherein the second wordline is formed with a buried metal rail.

10. A device comprising:
a bitcell having a physical layout of transistors arranged in a bitcell structure, wherein the transistors include first transistors and second transistors;
a first wordline coupled to the first transistors, wherein the first wordline is formed with a frontside metal rail; and
a second wordline coupled to one of the second transistors, wherein the second wordline is formed with a buried metal rail,
wherein the transistors include passgate transistors and a read transistor,
wherein the first wordline includes a write wordline coupled to the passgate transistors, and the write wordline is formed with the frontside metal rail, and
wherein the second wordline includes a read wordline coupled to the read transistor, and the read wordline is formed with the buried metal rail.

11. The device of claim 10, further comprising:
write bitlines coupled to the passgate transistors, wherein the write bitlines are formed with another buried metal.

12. The device of claim 10, further comprising:
a read bitline coupled to the read transistor, wherein the read bitline is formed with another buried metal rail.

13. The device of claim 9, wherein:
the transistors include passgate transistors and a read transistor,
the first wordline formed with the frontside metal includes a read wordline coupled to the read transistor, and the read wordline is formed with the frontside metal, and
the second wordline formed with the buried metal includes a write wordline coupled to the passgate transistors, and the write wordline is formed with the buried metal.

14. The device of claim 13, further comprising:
write bitlines coupled to the passgate transistors, wherein the write bitlines are formed with another buried metal.

15. A method comprising:
fabricating multiple transistors arranged as a bitcell; and
fabricating multiple wordlines coupled to the multiple transistors,
wherein at least one wordline of the wordlines is formed with a frontside metal rail, and
wherein at least one other wordline of the wordlines is formed with a buried metal rail.

16. The method of claim 15, wherein:
the multiple transistors include passgate transistors and a read transistor,
the at least one wordline includes a write wordline coupled to the passgate transistors, and the write wordline is formed with the frontside metal rail, and
the at least one other wordline includes a read wordline coupled to the read transistor, and the read wordline is formed with the buried metal rail.

17. The method of claim 16, further comprising:
fabricating multiple write bitlines coupled to the passgate transistors, wherein the multiple write bitlines are formed with other buried metal rails.

18. The method of claim 16, further comprising:
fabricating a read bitline coupled to the read transistor, wherein the read bitline is formed with another buried metal rail.

19. The method of claim 15, wherein:
the multiple transistors include passgate transistors and a read transistor,
the at least one wordline of the wordlines formed with the frontside metal rail includes a read wordline coupled to the read transistor, and the read wordline is formed with the frontside metal rail, and
the at least one other wordline of the wordlines formed with the buried metal rail includes a write wordline coupled to the passgate transistors, and the write wordline is formed with the buried metal rail.

20. The method of claim 19, further comprising:
fabricating multiple write bitlines coupled to the passgate transistors, wherein the multiple write bitlines are formed with other buried metal rails.

* * * * *